United States Patent [19]

Saitoh

[11] 4,382,289
[45] May 3, 1983

[54] SEMICONDUCTOR MEMORY DEVICE
[75] Inventor: Shinji Saitoh, Yokohama, Japan
[73] Assignee: Tokyo Shibaura Denki Kabushiki Kaisha, Kawasaki, Japan
[21] Appl. No.: 298,875
[22] Filed: Sep. 2, 1981
[30] Foreign Application Priority Data Oct. 7, 1980 [JP] Japan ................................ 55/139375

[51] Int. Cl.³ ............................................. G11C 17/00
[52] U.S. Cl. .......................................... 365/96; 357/4
[58] Field of Search .................. 365/96, 103, 104, 105, 365/174; 357/4, 51

[56] References Cited

U.S. PATENT DOCUMENTS 3,699,395 10/1972 Baleky .................................... 357/4
3,699,403 10/1972 Boleky .................................. 365/96
3,728,591 4/1973 Sunshine ................................ 357/4
3,976,983 8/1976 Moussie ................................ 365/96

FOREIGN PATENT DOCUMENTS 50-97286 8/1975 Japan.

Primary Examiner—Stuart N. Hecker
Attorney, Agent, or Firm—Finnegan, Henderson, Farabow, Garrett & Dunner

[57] ABSTRACT

A semiconductor memory device comprises an insulation layer and a plurality of polycrystalline silicon layer regions formed on the insulation layer. The polycrystalline silicon layer region includes a semiconductor element region and a meltable semiconductor fuse link region. The two regions are integrated with each other to constitute a unit memory cell. A plurality of unit memory cells connected between bit lines and word lines jointly constitute a memory device. Where required data is written in the memory device, then the semiconductor fuse region of a specified unit memory cell is melted away.

4 Claims, 6 Drawing Figures

SEMICONDUCTOR MEMORY DEVICE

BACKGROUND OF THE INVENTION

This invention relates to a semiconductor memory device and more particularly to a semiconductor memory device including memory cells, in which a prescribed program is set, and thereafter data stored in the memory device is fixed by melting away a fuse link constituting a memory cell.

Recently, demand is rapidly increases for the development of a programmable read only memory (abbreviated as "PROM") which enables the user to provide a program freely and quickly. A known memory cell constituting PROM includes the type in which the p-n junction of a semiconductor element constituting a memory cell is purposely destroyed or a fuse link forming part of a memory cell is melted away. A memory cell whose fuse link is melted away is formed of a combination of a diode 10 and a fuse link 11 as shown in FIG. 1. Description is now given of a memory cell connected between a word line $WL_1$ and bit line $BL_1$. If data stored in a memory cell whose fuse link 11 is not melted away is logically expressed as "1" or "0", then data stored in a memory cell whose fuse link 11 is melted away is indicated by the reverse logic level of "0" or "1". Therefore, the user can freely provide a program for PROM. The fuse link 11 is melted away by conducting a sufficient amount of current through the word line $WL_1$ and bit line $BL_1$. The melting of the fuse link 11 constitutes a writing operation. The fuse link 11 is generally formed of a nichrome alloy or polycrystalline silicon layer.

FIG. 2 is a sectional view of a prior art diode memory cell having a fuse link. In FIG. 2, an n+ layer 13 is embedded in a p type semiconductor substrate 12. An n type layer 14 is epitaxially grown on the substrate 12. A plurality of p+ type partitioning regions 15 are formed to separate the respective memory cells from each other. An n+ type diffused region 16 and p type diffused region 17 are formed in the N type epitaxial layer 14 disposed between every adjacent partitioning regions 15. An aluminium electrode 19 is formed to connect through a contact hole provided in an insulation layer 18, the n+ type diffused region 16 and one end of the fuse link 11. Another aluminium electrode 20 constituting a word line $WL_1$ is formed in contact with the p type diffused region 17 through a contact hole of the insulation layer 18. Still another aluminium electrode 21 constituting the bit line $BL_1$ contacts the other end of the fuse 11. The diode 10 is formed of a p-n junction defined between the p type diffused region 17 and n type epitaxial layer 14.

With the memory cell of FIG. 2, a certain masking allowance should be taken when the partition region 15, p type diffused region 17 and n+ type diffused region 16 are formed in the n type epitaxial layer 14. It is further necessary to provide a sufficient space between the p+ type partitioning region 15 and p type diffused region 17, as well as between the p type diffused region 17 and n+ type diffused region 16 in order to elevate the breakdown voltage therebetween. Therefore, the diode region is increased in area, resulting in the failure to integrate the memory cells with the greater density. Further, a relatively large capacitance is sustained in a space defined between the p+ type partitioning region 15 and n type epitaxial layer 14 and also in the p-n junction of the diode 10, making it impossible to elevate the switching speed of the memory cell.

SUMMARY OF THE INVENTION

It is accordingly the object of this invention to provide a semiconductor memory device which comprises memory cells, each formed of an integral combination of a semiconductor region and fuse link region, and allows for a denser integration and a higher switching speed.

To attain the above-mentioned object, this invention provides a semiconductor memory device which comprises an insulation layer; and a plurality of polycrystalline silicon layer regions formed on the insulation layer and wherein each polycrystalline silicon layer region includes a semiconductor element region and a semiconductor fuse region containing a meltable fuse; and the semiconductor element region and semiconductor fuse region are integrated with each other to constitute a memory cell of the semiconductor device.

According to the invention, the denser integration and elevation of switching speed of the memory cells are attained.

DETAILED DESCRIPTION OF THE PREFERRED EMBODIMENTS

Figure 3:
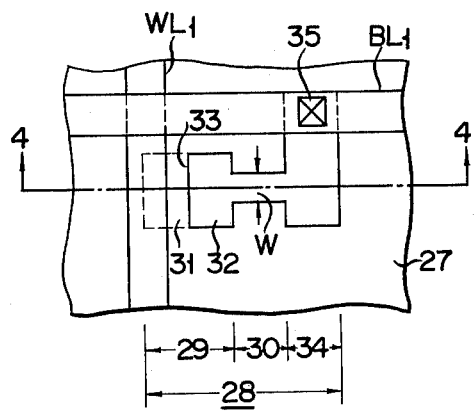
FIG. 3 is a plan view of a unit memory cell according to a first embodiment of this invention which is included in a memory device.
Figure 4:
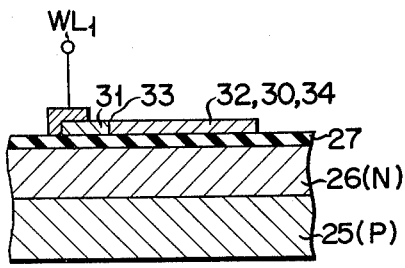
FIG. 4 is a sectional view of the memory cell of FIG. 3 on line 4—4.

Referring to FIGS. 3 and 4, an n type layer 26 is epitaxially grown on a p type semiconductor substrate 25. An oxide layer 27 is deposited on the n type layer 26 with a thickness ranging, for example, from several thousand Å units to 1 micron. A polycrystalline silicon layer region 28 is formed on the oxide layer 27. This region 28 is defined by selectively etching a polycrystalline silicon layer deposited on the oxide layer 27. The region 28 consists of a diode region 29 and fuse region 30 integrated with each other. The portion 31 of the diode region 29 is of the p type, and the portion 32 thereof is of the n type. A p-n junction having a diode function is formed at a boundary 33 between the p type portion 31 and n type portion 32. The fuse region 30 and the portion 34 of the region 28 are of the n type. The indicated left end of the portion 31 is connected to the word line $WL_1$, and the indicated upper end of the portion 34 is connected to a bit line $BL_1$ by means of a contact 35. The word line $WL_1$ and bit line $BL_1$ intersect each other at a predetermined angle, with an insulation layer (not shown) disposed therebetween. The above-mentioned polycrystalline silicon layer is deposited with a thickness of approximately 2000 to 3000 Å units. The fuse region 30 is chosen to have a width of 2-5 microns. Where a p type polycrystalline silicon layer is formed on the oxide layer 27, it is necessary to dope the portions 32, 34 and fuse region 30 with an n type impurity. Where the fuse region 30 is melted away in setting a program, that is, writing data in a memory device after forming a memory cell as shown in FIGS. 3 and 4, the fuse region 30 can be melted away in 100 to several microseconds by supplying current of 40 to 50 mA to the diode 10 through the word line $WL_1$ and bit line $BL_1$.

Figure 1:
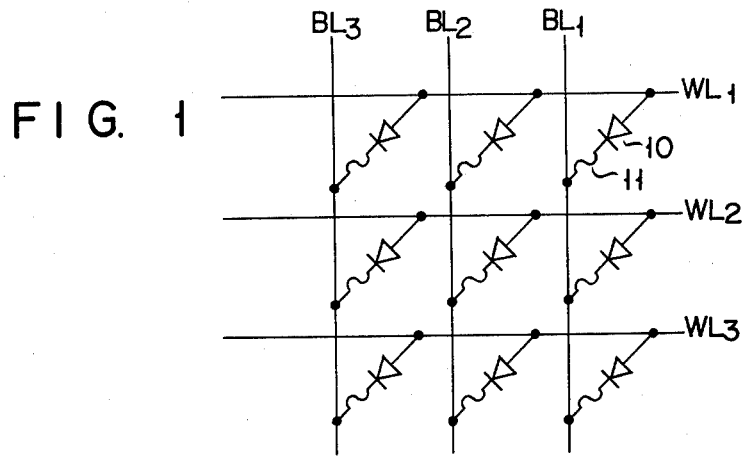
FIG. 1 is a diagram showing the manner in which matrix-arranged unit memory cells each formed of a diode and fuse link are connected to word lines and bit lines.
Figure 2:
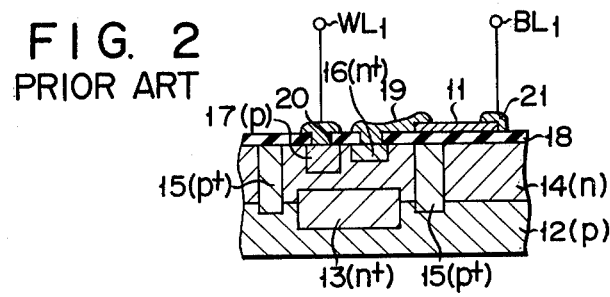
FIG. 2 is a sectional view of the conventional unit memory cell formed of a diode and fuse.

With the above-mentioned first embodiment, the diode 10 does not require a relatively large plain space as shown in FIG. 2, but can be formed very closely to the fuse region 30 (FIG. 3). Therefore, the first embodiment enables memory cells to be integrated with about 4 times greater density than the conventional memory cell of FIG. 2. It is to be noted in this case that the respective memory cells are separated from each other simply spatially, but not by means of a conductor region, thereby contributing to the elevation of the density of integration. Further, the semiconductor memory device of the invention can be very easily manufactured simply by the step of selectively etching a polycrystalline silicon layer deposited on the insulation layer 27 and the step of diffusing an n type impurity in part of the silicon layer region 28. Since a memory cell is formed on the insulation layer 27, a capacitance is only sustained in the junction of the diode 10, prominently elevating the switching speed of a memory cell.

Figure 5:
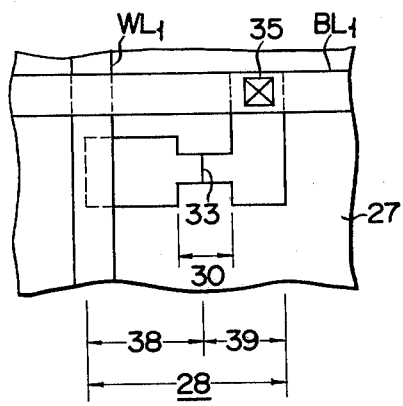
FIG. 5 is a plan view of a unit memory cell according to a second embodiment of the invention which is included in a memory device.

Obviously, this invention is not limited to the embodiment of FIGS. 3 and 4. For example, a polycrystalline silicon layer substantially free from a p or n type impurity may be formed on the insulation layer 27 instead of a p type polycrystalline silicon layer, and where semiconductor elements (for example, transistors) different from those of a memory device are formed on the semiconductor substrate, it is possible to dope the polycrystalline silicon layer with a p type impurity at the same time, as when the bases of the transistors and required resistance regions are doped with the p type impurity. Further, the portions 32, 30, 34 may be doped with an n type impurity at the same time as when the emitters and collectors of transistors formed on the semiconductor substrate are doped with the n type impurity. The positions of the word line $WL_1$ and bit line $BL_1$ of FIG. 3 can be exchanged for each other by forming the portion 31 in the n type and the portions 32, 30, 34 in the p type. Further, as shown in FIG. 5, it is possible to form the portion 38 of the silicon layer region 28 in the p type and the portion 39 thereof in the n type, and dispose the p-n junction 33 in the fuse region 30.

Figure 6:
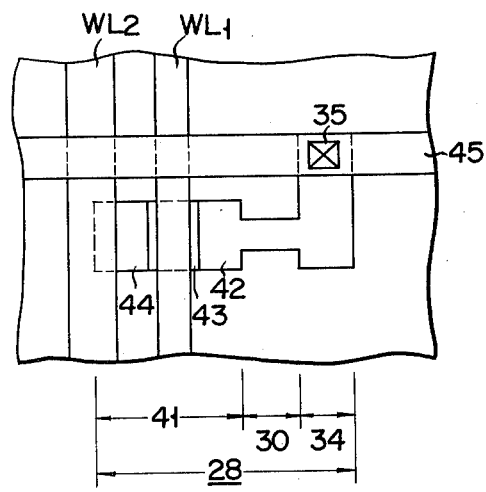
FIG. 6 is a plan view of a unit memory cell according to a third embodiment of the invention which is included in a memory device.

The memory cells of this invention constituting a memory device may respectively be formed of a combination of a bipolar transistor and fuse. Referring to FIG. 6, a polycrystalline silicon layer region 28 includes a transistor region 41, fuse region 30 and portion 34. The transistor region 41 includes an n type region 42, p type region 43 and n type region 44. The fuse region 30 and portion 34 are of the n type. An emitter region 42 is connected to a bit line 45 through the fuse region 30, portion 34 and contact 35. The base region 43 is connected to the word line $WL_1$, and the collector region 43 is connected to a word line $WL_2$. Impression of proper voltage on the word lines $WL_1$-$WL_2$ gives rise to the flow of base current. Amplified current runs between the emitter 42 and bit line 45, enabling the fuse region 30 to be melted away. With the third embodiment of FIG. 6, the fuse region 30 can be melted away simply by conducting extremely small current through the word line $WL_1$. As in the first embodiment of FIGS. 3 and 4, the third embodiment of FIG. 6 also assures the denser integration and higher switching speed of memory cells and the easy manufacture of a semiconductor memory device.

What is claimed is:

1. A semiconductor memory device which comprises:
    an insulation layer; and
    a plurality of polycrystalline silicon layer regions formed on said insulation layer, and
    wherein each polycrystalline silicon layer region includes a semiconductor element region and a semiconductor fuse region containing a meltable fuse link; and said semiconductor element region and said semiconductor fuse region are integrated with each other to constitute a memory cell of said semiconductor memory device.

2. The semiconductor memory device according to claim 1, wherein said insulation layer is formed on a semiconductor substrate.

3. The semiconductor memory device according to claim 1, wherein said semiconductor element region includes a diode.

4. The semiconductor memory device according to claim 1, wherein said semiconductor element region includes a bipolar transistor.

* * * * *